United States Patent [19]

Walters, Jr.

[11] Patent Number: 4,825,101
[45] Date of Patent: Apr. 25, 1989

[54] FULL-LEVEL, FAST CMOS OUTPUT BUFFER

[75] Inventor: Donald M. Walters, Jr., Austin, Tex.

[73] Assignee: Advanced Micro Devices, Inc., Sunnyvale, Calif.

[21] Appl. No.: 154,723

[22] Filed: Feb. 11, 1988

[51] Int. Cl.⁴ ............... H03K 19/094; H03K 17/284; H03K 19/20

[52] U.S. Cl. .................................. 307/270; 307/263; 307/446; 307/451

[58] Field of Search ............ 307/263, 270, 446, 451, 307/443, 579

[56] References Cited

U.S. PATENT DOCUMENTS

| | | | |
|---|---|---|---|
| 4,540,904 | 9/1985 | Ennis et al. | 307/270 |
| 4,567,378 | 1/1986 | Raver | 307/270 |
| 4,684,824 | 8/1987 | Moberg | 307/270 |
| 4,731,553 | 3/1988 | Van Lehn et al. | 307/270 |
| 4,749,882 | 6/1988 | Morgan | 307/263 |
| 4,769,561 | 9/1988 | Iwamura et al. | 307/446 |
| 4,779,014 | 10/1988 | Masuoka et al. | 307/451 |

Primary Examiner—John S. Heyman
Attorney, Agent, or Firm—Davis Chin

[57] ABSTRACT

An output buffer includes a pull-up circuit and a pull-down circuit for driving widely varying capacitive and inductive loads without significant output ringing. The pull-up circuit includes a first pull-up transistor (N2), a NAND logic gate (42) and a second pull-up transistor (P2). The pull-down circuit includes a first pull-down transistor (P3), a NOR logic gate (38) and a second pull-down transistor (N3). Output impedance is increased and energy stored in parasitic inductance is decreased by the pull-up and pull-down transistors so as to reduce significantly the inductive ringing while accelerating output transitions.

18 Claims, 2 Drawing Sheets

PRIOR ART BUFFER

OUTPUT BUFFER

ALTERNATIVE BIPOLAR BUFFER

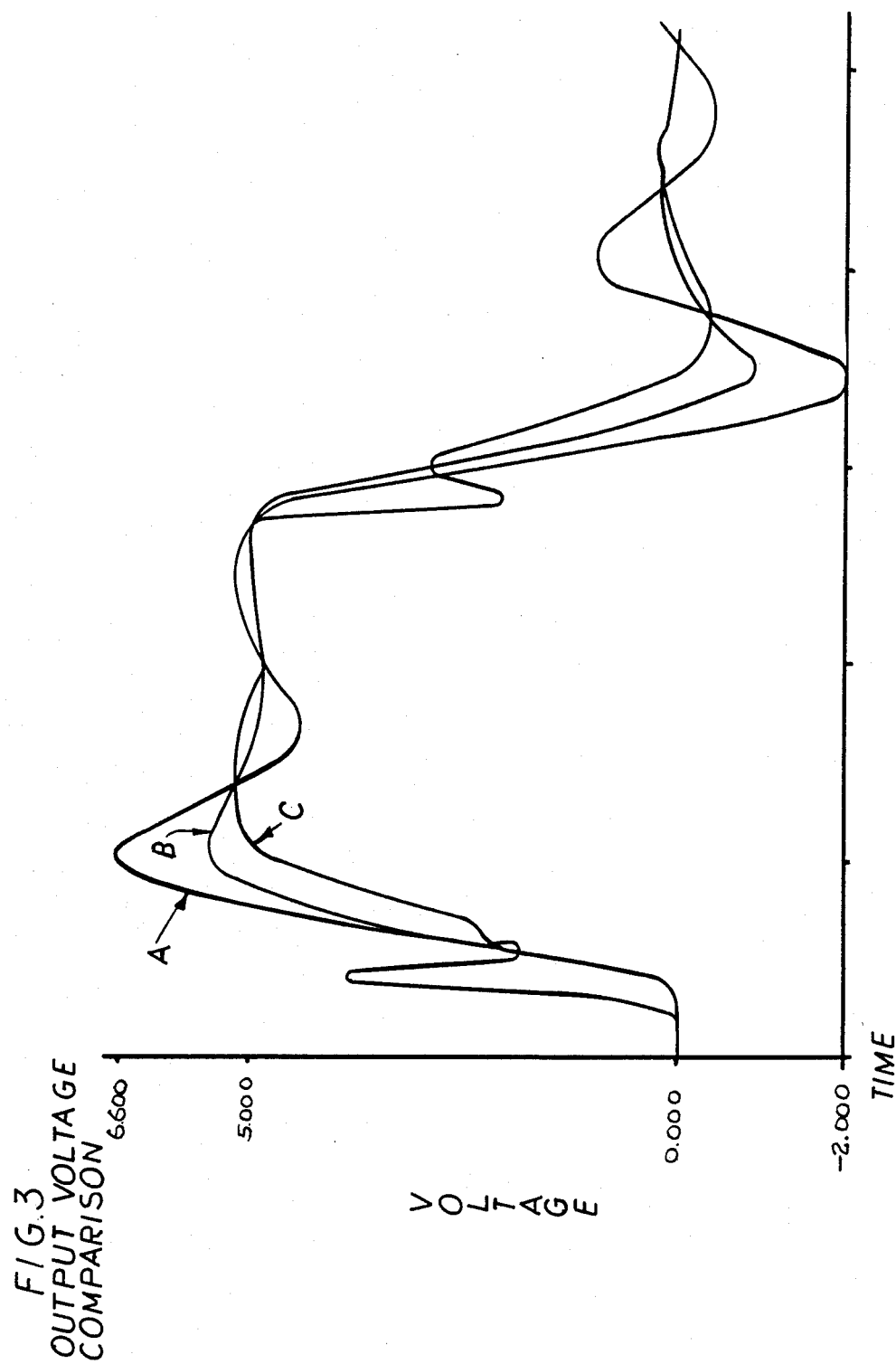

FULL-LEVEL, FAST CMOS OUTPUT BUFFER

BACKGROUND OF THE INVENTION

This invention relates generally to integrated circuits and more particularly, it relates to a full-level, fast CMOS output buffer for driving widely varying capacitive and inductive loads without significant output ringing.

As is well known, digital logic cicuits are widely used in the electronics field. One such use is for the interfacing between the logic of one integrated circuit device and another integrated circuit device. An output buffer is an important component for this interface function. The output buffer provides, when enabled, an output signal which is a function of a data input signal received from other logic circuitry of the integrated circuit.

Output buffer circuits typically use a pull-up field-effect transistor (FET) and a pull-down field-effect transistor connected to an output node. Depending upon the state of the data input signal and an enable signal, either the pull-up or pull-down field-effect transistor is quickly turned on and the other one of them is turned off.

Such prior art output buffer circuits generally have the output node connected to an external pin of an integrated circuit for driving other circuitry on other integrated circuits which may have widely varying capacitive and inductive loading effects. When the output node is making a high-to-low or low-to-high transition, oscillation or inductive ringing appears on the output node of the buffer circuit as a function of the energy remaining in the parasitic interconnect inductances following the output transition and the impedance of the output driver in a circuit that includes the output loads, buffer drivers, and the ground loop.

It would therefore be desirable to provide an output buffer for driving widely varying capacitive and inductive loads which has a significant reduction in inductive ringing at an output node. The output buffer circuit of the present invention includes a pull-up circuit formed of a first pull-up transistor and a second pull-up transistor and a pull-down circuit formed of a first pull-down transistor and a second pull-down transistor. The reduction in the inductive ringing at the output node is achieved by increasing the driving transistors' equivalent impedance at the output node towards the end of either a low-to-high or high-to-low transistion.

SUMMARY OF THE INVENTION

Accordingly, it is a general object of the present invention to provide an improved output buffer which is relatively simple and economical to manufacture and assemble, but yet overcomes the disadvantages of the prior art buffers.

It is another object of the present invention to provide an improved output buffer which has a significant reduction in inductive ringing at an output node.

It is another object of the present invention to provide an improved output buffer which includes a pull-up circuit formed of a first pull-up transistor and a second pull-up transistor and a pull-down circuit formed of a first pull-down transistor and a second pull-down transistor.

It is still another object of the present invention to provide an improved output buffer which includes a pull-up circuit formed of a first inverter, a second inverter, a first pull-up N-channel transistor, a NAND logic gate, and a second pull-up P-channel transistor.

In accordance with these aims and objectives, the present invention is concerned with the provision of an improved output buffer for driving widely varying capacitive and inductive loads which has a significant reduction in inductive ringing at an output node. The output buffer includes a pull-up circuit and a pull-down circuit. The pull-up circuit is responsive to a first control signal for generating a transition from a low logic level to a high logic level at the output node. The pull-down circuit is responsive to a second control signal for generating a transition from the high logic level to the low logic level at the output node.

The pull-up circuit includes a first inverter, a second inverter, a first pull-up N-channel transistor, a NAND logic gate, and a second pull-up P-channel transistor. The pull-down circuit includes a third inverter, a fourth inverter, a first pull-down P-channel transistor, a NOR logic gate, and a second pull-down N-channel transistor.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 3 illustrates the voltages at the respective output nodes for both the prior art buffer circuit and the buffer circuit of the present invention.

DESCRIPTION OF THE PREFERRED EMBODIMENTS

Figure 1:
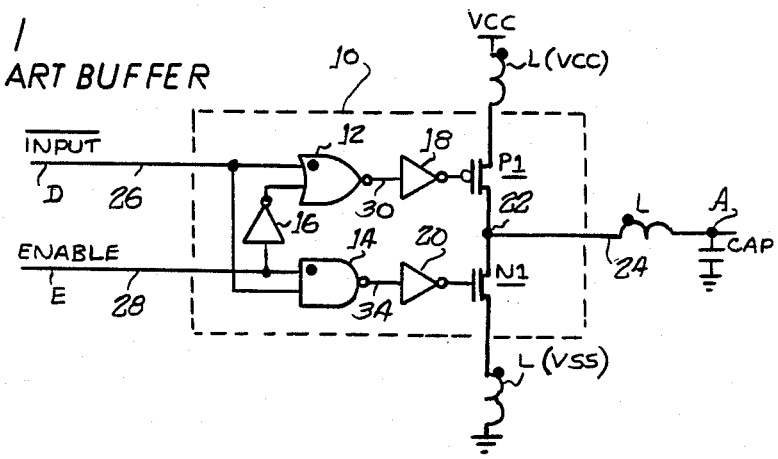
FIG. 1 is a schematic circuit diagram of a prior art output buffer utilizing a P-channel pull-up FET and an N-channel pull-down FET.

Referring now in detail to the drawings, there is shown in FIG. 1 a schematic circuit diagram of a prior art output buffer circuit 10 formed of a P-channel pull-up field-effect transistor (FET) P1 and an N-channel pull-down FET N1. The buffer circuit 10 provides an output signal at an output node A in response to a data input signal $\overline{\text{INPUT}}$ received at a data input node D and an enable signal ENABLE received at enable input node E. The buffer circuit 10 includes a NOR logic gate 12, a NAND logic gate 14, and inverters 16, 18 and 20.

The output node A of the buffer circuit 10 is used to drive a varying capacitive and inductive load represented by impedance CAP. Further, the output node A is typically connected to an internal node 22 via a lead connection 24 having parasitic inductance L.

The NOR logic gate 12 receives the data input signal $\overline{\text{INPUT}}$ on line 26 on its one input and the enable signal ENABLE on line 28 via the inverter 16 on its other input. The output of the NOR logic gate 12 on line 30 is supplied to the gate of the P-channel pull-up transistor P1 via the inverter 18. The transistor P1 has its source connected via a lead line having parasitic inductance L(VCC) to a supply potential VCC, which is typically 5.0 volts, and has its drain connected via the lead connection 24 with the parasitic inductance L to the output node A.

The NAND logic gate 14 receives the same data input signal $\overline{INPUT}$ on line 26 on its one input and the same enable signal ENABLE on the line 28 on its other input. The output of the NAND gate 14 on line 34 is applied to the gate of the N-channel pull-down transistor N1 via the inverter 20. The transistor N1 has its source connected via a lead line having parasitic inductance L(VSS) to a ground potential and its drain also connected via the lead connection 24 to the output node A.

When the enable signal ENABLE is at a high (VCC) or logic "1" level and the data input signal $\overline{INPUT}$ is at a low or logic "0" level (GND), the output of the NOR gate 12 will be at the high logic level and the output of the NAND gate 14 will be at the high logic level. Due to the inverter 18, this causes a logic "0" (GND) to be applied to the gate of the transistor P1. Due to the inverter 20, this causes a logic "0" (GND) to be applied to the gate of the transistor N1. As a result, the P-channel transistor P1 is turned on and the N-channel N1 is turned off. Thus, the output node A is pulled towards the supply potential VCC.

On the other hand, when the enable signal ENABLE is at the high (VCC) or logic "1" level and the data input signal $\overline{INPUT}$ is at a high (VCC) or logic "1" level, the output of the NOR gate 12 will be at the low or logic "0" level and the output of the NAND gate 14 will be at the low logic level. Due to the inverter 18, this causes a logic "1" (VCC) to be applied to the gate of the transistor P1. Due to the inverter 20, this causes a logic "1" (VCC) to be applied to the gate of the transistor N1. As a result, the P-channel transistor P1 is turned off and the N-channel transistor N1 is turned on. Thus, the output node A is pulled down towards the ground potential.

When the enable signal ENABLE is at the low or logic "0" level (GND), the output of the NOR gate 12 is at the low or logic "0" level and the output of the NAND gate 14 is at the high or logic "1" level. Consequently, both of the transistors P1 and N1 are caused to be turned off. This produces a high impedance tri-state mode at the output node A in which the output buffer circuit 10 is not enabled.

The magnitude of the voltage at the output node A in the buffer circuit 10 is dependent upon the capacitive and inductive load or impedance CAP being driven and the parasitic inductances. Dependent upon the logic state of the data input signal $\overline{INPUT}$ when the enable signal ENABLE is activated, either the pull-up or pull-down FET is quickly turned on and the other one of them is turned off. Such rapid switching on of the pull-up or pull-down field-effect transistors causes sudden surges of current commonly known as current spikes. These current spikes will flow through the parasitic inductances in the lead connections so as to cause oscillations or inductive ringing at the output node A of the buffer circuit 10.

Figure 2:
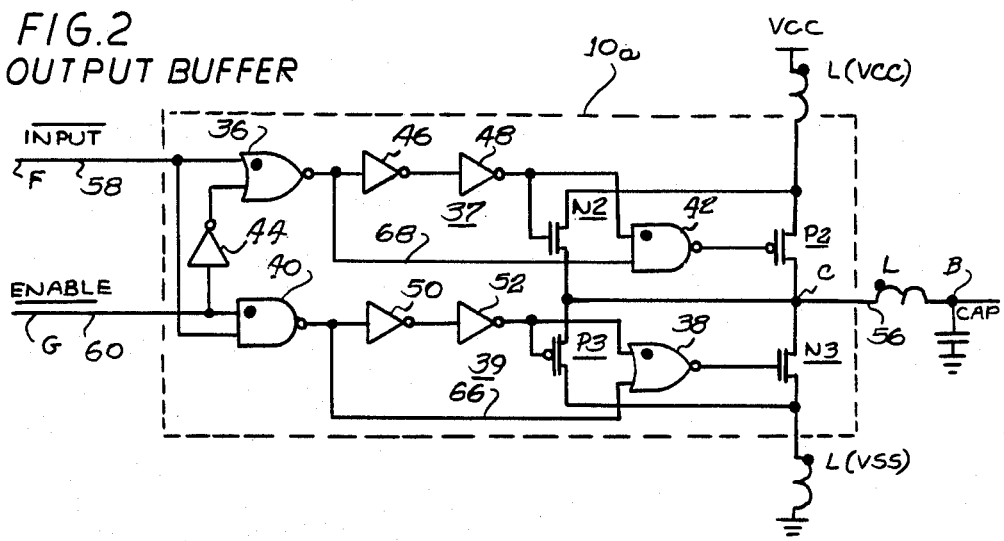
FIG. 2 is a schematic circuit diagram of an output buffer constructed in accordance with the principles of the present invention.

In FIG. 2 there is shown an output buffer circuit 10a of the present invention which represents an improvement over the buffer circuit 10 of FIG. 1. The buffer circuit 10a provides the capability of driving quickly output loads that vary widely in capacitance and inductance to full-levels but yet reduces significantly the inductive ringing in the output signal due to the pull-up and pull-down output drivers switching states. The output buffer circuit 10a provides an output signal at an output node B in response to a data input signal $\overline{INPUT}$ received at data input node F and an enable signal ENABLE received at enable input node G.

The output buffer circuit 10a includes a NOR logic gate 36, a NAND logic gate 40, an inverter 44, a pull-up circuit 37, and a pull-down circuit 39. The pull-up circuit 37 includes inverters 46, 48; a first pull-up N-channel transistor N2; a NAND logic gate 42; and a second pull-up P-channel transistor P2. The pull-down circuit 39 includes inverters 50, 52; a first pull-down P-channel transistor P3; a NOR logic gate 38; and a second pull-down N-channel transistor N3. Similarly, the output node B is connected to an internal node C via a lead connection 56 having parasitic inductance L. A widely varying capacitive and inductive load represented by impedance CAP is connected between the output node B and a ground potential.

The NOR logic gate 36 receives the data input signal $\overline{INPUT}$ on line 58 on its one input and the enable signal ENABLE on line 60 via the inverter 44 on its other input. The output of the NOR gate 36 provides a first control signal and is inverted twice by the inverters 46, 48. The output of the inverter 48 is connected to the gate of the first pull-up transistor N2 and to one input of the NAND gate 42. The output of the NOR logic gate 36 is also connected to the other input of the NAND gate 42. The first pull-up transistor N2 has its drain connected via a lead line having parasitic inductance L(VCC) to a supply potential VCC and its source connected via a lead line having parasitic inductance L to the output node B. The output of the NAND gate 42 is connected to the gate of the second pull-up transistor P2. The second pull-up transistor P2 has its source connected also via the line with the parasitic inductance L(VCC) to the supply potential VCC and its drain connected via the line 56 to the output node B.

The NAND logic gate 40 receives the same data input signal $\overline{INPUT}$ on line 58 on its one input and the same enable signal ENABLE on line 60 on its other input. The output of the NAND logic gate 40 provides a second control signal and is inverted twice by the inverters 50, 52. The output of the inverter 52 is connected to the gate of the first pull-down transistor P3 and to one input of the NOR gate 38. The output of the NAND gate 40 is also connected to the other input of the NOR gate 38. The first pull-down transistor P3 has its source connected via the line 56 to the output node B and its drain connected via the line with the parasitic inductance L(VSS) to the ground potential. The output of the NOR gate 38 is connected to the gate of the second pull-down transistor N3. The second pull-down transistor N3 has its drain connected also via the line 56 to the output node B and its source connected via the line with the parasitic inductance L(VSS) to the ground potential.

The operation of the buffer circuit 10a of FIG. 2 will now be described. In particular, the pull-up action in FIG. 2 will first be explained. The voltages at the nodes A, B and C are illustrated in FIG. 3. When the output node B is to be pulled to the high or logic "1" level, the enable signal ENABLE must be at the high logic level and the data input signal $\overline{INPUT}$ must be at the low logic level. Thus, the output of the NOR gate 36 is at the high logic level. Due to the inverters 46 and 48, the output of the inverter 48 will be at the high logic level. This causes the first pull-up transistor N2 to turn on and after a delay from the NAND gate 42, the second pull-up transistor P2 will also be turned on since the output of the NAND gate 42 will be at a low logic level.

The pull-up action is started initially by the turning on of the first pull-up transistor N2 followed quickly by the turning on of the second pull-up transistor P2. The transistors N2 and P2 supply current to drive the output node B from the low logic state to the high logic state. The voltage on node C leads the voltage on node B as current in parasitic interconnect inductance L builds up to a peak in the early part of the transistion due to both transistors N2 and P2 having turned on with the maximum drain-to-source voltage. As the voltage on node C increases further, the current in inductance L decreases causing the voltage on node C to lag the voltage on the output node B. As the voltage on node C approaches one threshold drop below the supply potential VCC, the first pull-up transistor N2 turns off increasing the output impedance. This increased output impedance has two effects: (1) the drive current in the interconnect inductance L is reduced earlier in the transition and more quickly than in an equivalent prior art output buffer dissipating the energy stored in the interconnect inductance and causing the voltage across inductance L to increase temporarily; and (2) the low-to-high transition rate of node C is reduced with a subsequent damped response. The resulting response of output node B reflects the dampened response of node C with an offset voltage in the parasitic inductance L that accelerates the completion of the output transition.

If the parasitic inductance L is sufficiently large, there is one further effect that reduces the energy stored in the parasitic interconnect inductance and thus reduces the output ringing. In the early stages of the transition the voltage on node C leads that on node B approaching a threshold below the supply voltage VCC causing the first pull-up transistor N2 to turn off. This reduces the drive current causing the voltage on the node C to quickly lag that on the output node B and fall once again turning on the transistor N2. Since the pull-up transistor N2 is off in part of the early stages of the output transition, the drive current level reached in the interconnect inductance L is reduced relative to that reached by a comparable prior art output buffer. The remainder of the transition continues as previously described and is illustrated in FIG. 3.

The pull-down action in FIG. 2 will be next explained. When the output node B is to be pulled to the low logic level, the enable signal ENABLE must be at a high logic level and the data input signal $\overline{INPUT}$ must be at a high logic level. Thus, the output of the NAND logic gate 40 will be at a low logic level. Due to the inverters 50 and 52, the output of the inverter 52 will be at a low logic level. This causes the first pull-down transistor P3 to be turned on and after a delay from the NOR logic gate 38, the second pull-down transistor N3 will also be turned on.

The pull-down action is started initially by the turning on of the first pull-down transistor P3 followed by the turning on of the second pull-down transistor N3. The transistors P3 and N3 supply current to drive the output node B from the high logic state to the low logic state. The voltage on node C leads the voltage on node B as current in inductance L builds up to a peak in the early part of the transition due to both transistors P3 and N3 having turned on with the maximum drain-to-source voltage. As the voltage on node C decreases further, the current in inductance L decreases causing the voltage on node C to lag the voltage on the output node B. As the voltage on node C approaches a threshold drop above ground potential VSS, the first pull-down transistor P3 turns off increasing the output impedance. This increased output impedance has two effects: (1) the drive current in the parasitic interconnect inductance L is reduced earlier in the transition and more quickly than in an equivalent conventional output buffer dissipating the energy stored in the interconnect inductance L and causing the voltage across inductance L to increase temporarily; and (2) the high-to-low transition rate of node C is reduced with a subsequent damped response. The resulting response of output node B reflects the dampened response of node c with an offset voltage in the parasitic inductance L that accelerates the completion of the output transition.

If the parasitic inductance L is sufficiently large, there is one further effect that reduces the energy stored in the parasitic interconnect inductance and thus reduces the output ringing. In the early stages of the transition the voltage on node C leads that on node B approaching a threshold above the ground potential VSS causing the first pull-down transistor P3 to turn off. This reduces the drive current causing the voltage on the node C to quickly lag that on the output node B and rise once again turning on the transistor P3. Since the pull-down transistor P3 is off in part of the early stages of the output transition, the drive current level reached in the interconnect inductance L is reduced relative to that reached by a comparable prior art output buffer. The remainder of the transition continues as previously described and is illustrated in FIG. 3.

When the output node B is again required to be switched back to the high logic level (i.e., the output of the NAND logic gate 40 goes to a high or logic "1"), the second input of the NOR logic gate 38 on line 66 is used to bypass the delay which would otherwise be experienced due to the inverters 50, 52 so as to quickly switch the gate of the transistor N3 to a low or logic "0" level. This reduces the amount of time it takes to turn off the second pull-down transistor N3. Similarly, when the output node B is required to be switched back to the low logic level (i.e., the output of the NOR logic gate 36 goes to a high or logic "1"), the second input of the NAND gate 42 on line 68 is used to bypass the delay which would otherwise by experienced due to the inverters 46, 48 so as to quickly switch the gate of the transistor P2 to a high or logic "1" level. This reduces the amount of time it takes to turn off the second pull-up transistor P2.

In FIG. 3, there are shown for comparison a computer simulation of the voltages at the output node A for the prior art buffer circuit 10 and the nodes B and C for the buffer circuit 10a of the present invention. The waveform A of FIG. 3 illustrates the voltage at the output node A of FIG. 1 in response to when the data input signal $\overline{INPUT}$ makes a first high-to-low transition and a second low-to-high transition. The waveforms B and C of FIG. 3 illustrate the corresponding voltages at the output node B and the node C of FIG. 2 in response to when the data input signal $\overline{INPUT}$ makes a first high-to-low transition and a second low-to-high transition. By comparing the waveforms A and B, it can thus be seen that the overshooting of the supply potential of +5 volts in the buffer circuit of FIG. 2 is about one volt less than the prior art buffer circuit in FIG. 1. Yet, the initial rise times in making the low-to-high transition at the respective output nodes A and B are substantially the same.

Figure 4:
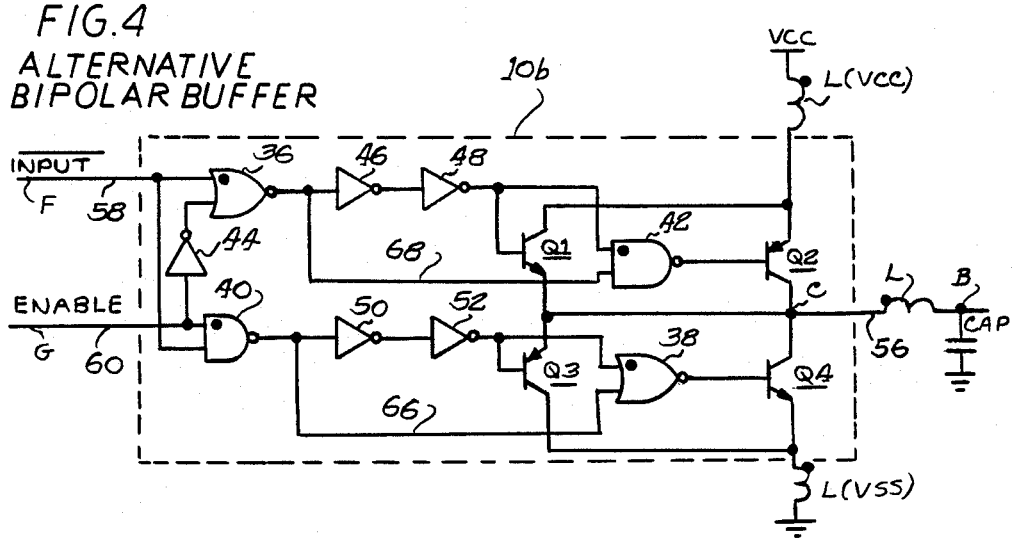
FIG. 4 is a schematic circuit diagram of an alternative output buffer constructed in accordance with the principles of the present invention using bipolar transistors.

FIG. 4 is a schematic circuit diagram of an alternative output buffer 10b of the present invention. As can be seen, the first pull-up transistor N2 and the second pull-up transistor P2 of FIG. 2 have been replaced with respective bipolar transistors Q1 and Q2. Further, the first pull-down transistor P3 and the second pull-down transistor N3 have been replaced with respective bipolar transistors Q3 and Q4. Except for these differences, the operation of the output buffer 10b functions identically to the output buffer 10a described previously and thus will not be repeated.

From the foregoing detailed description, it can be seen that the present invention provides an improved output buffer for driving widely varying capacitive and inductive loads without significant output ringing. The output buffer of the present invention includes a pull-up circuit formed of a first pull-up transistor and a second pull-up transistor, and a pull-down circuit formed of a first pull-down transistor and a second pull-down transistor.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. An output buffer for driving widely varying capacitive and inductive loads which has a significant reduction in inductive ringing at an output node, comprising:

pull-up circuit means responsive to a first control signal for generating a transition from a low logic level to a high logic level at the output node;

said pull-up circuit means including a first inverter (46), a second inverter (48), a first pull-up N-channel transistor (N2), a NAND logic gate (42), and a second pull-up P-channel transistor (P2);

said first inverter (46) having its input connected to receive the first control signal and its output connected to the input of said second inverter (48), the output of said second inverter (48) being connected to the gate of said first pull-up transistor (N2) and to a first input of said NAND gate (42), said first pull-up transistor (N2) having its drain connected to a supply potential and its source connected to the output node;

said NAND gate (42) having a second input connected to receive the first control signal and its output connected to the gate of said second pull-up transistor (P2), said second pull-up transistor (P2) having its source connected to the supply potential and its drain connected to the output node;

pull-down circuit means responsive to a second control signal for generating a transition from the high logic level to the low logic level at the output node;

said pull-down circuit means including a third inverter (50), a fourth inverter (52), a first pull-down P-channel transistor (P3), a NOR logic gate (38), and a second pull-down N-channel transistor (N3);

said third inverter (50) having its input connected to receive the second control signal and its output connected to the input of said fourth inverter (52) being connected to the gate of said first pull-down transistor (P3) and to a first input of said NOR gate (38), said first pull-down transistor (P3) having its source connected to the output node and its drain connected to a ground potential;

said NOR gate (38) having a second input connected to receive the second control signal and its output connected to the gate of said second pull-down transistor (N3), said second pull-down transistor (N3) having its drain connected to the output node and its source connected to the ground potential, whereby output impedance is increased towards the end of an output transition and energy stored in parasitic inductance is decreased by said pull-up and pull-down transistors so as to reduce the inductive ringing while accelerating the completion of the output transition.

2. An output buffer as claimed in claim 1, wherein said second pull-up transistor (P2) and said second pull-down transistor (N3) are delayed in their turn-on times relative to the respective said first pull-up transistor (N2) and said first pull-down transistor (P3).

3. An output buffer as claimed in claim 2, further comprising first logic means responsive to a data input signal making a high-to-low transition for generating the first control signal.

4. An output buffer as claimed in claim 3, wherein said first logic means comprises a second NOR logic gate (36).

5. An output buffer as claimed in claim 4, further comprising second logic means responsive to the data input signal making a low-to-high transition for generating the second control signal.

6. An output buffer as claimed in claim 5, wherein said second logic means comprises a second NAND logic gate (40).

7. An output buffer as claimed in claim 6, wherein said first pull-up transistor (N2) is initially turned on followed quickly by the turning on of said second pull-up transistor (P2) for generating the low-to-high transition at the output node, and wherein said first pull-up transistor (N2) turns off at the end of the low-to-high transition so as to increase the output impedance.

8. An output buffer as claimed in claim 7, wherein said first pull-down transistor (P3) is initially turned on followed quickly by the turning on of said second pull-down transistor (N3) for generating the high-to-low transition at the output node, and wherein said first pull-down transistor (P3) turns off at the end of the high-to-low transition so as to increase the output impedance.

9. An output buffer as claimed in claim 1, wherein said NAND logic gate (42) is used to quickly turn off the second pull-up transistor (P2) when the output node is making a high-to-low transition.

10. An output buffer as claimed in claim 9, wherein said NOR logic gate (38) is used to quickly turn off the second pull-down transistor (N3) when the output node is making a low-to-high transition.

11. An output buffer for driving widely varying capacitive and inductive loads which has a significant reduction in inductive ringing at an output node, comprising:

pull-up circuit means responsive to a first control signal for generating a transition from a low logic level to a high logic level at the output node;

said pull-up circuit means including a first inverter (46), a second inverter (48), a first pull-up NPN bipolar transistor (Q1), a NAND logic gate (42), and a second pull-up PNP bipolar transistor (Q2);

said first inverter (46) having its input connected to receive the first control signal and its output connected to the input of said second inverter (48), the output of said second inverter (48) being connected to the base of said first pull-up transistor (Q1) and to a first input of said NAND gate (42), said first pull-up transistor (Q1) having its collector connected to a supply potential and its emitter connected to the output node;

said NAND gate (42) having a second input connected to receive the first control signal and its output connected to the base of said second pull-up transistor (Q2), said second pull-up transistor (Q2) having its emitter connected to the supply potential and its collector connected to the output node;

pull-down circuit means responsive to a second control signal for generating a transition from the high logic level to the low logic level at the output node;

said pull-down circuit means including a third inverter (50), a fourth inverter (52), a first pull-down PNP bipolar transistor (Q3), a NOR logic gate (38), and a second pull-down NPN bipolar transistor (Q4);

said third inverter (50) having its input connected to receive the second control signal and its output connected to the input of said fourth inverter (52), the output of said fourth inverter (52) being connected to the base of said first pull-down transistor (Q3) and to a first input of said NOR gate (38), said first pull-down transistor (Q3) having its emitter connected to the output node and its collector connected to a ground potential;

said NOR gate (38) having a second input connected to receive the second control signal and its output connected to the base of said second pull-down transistor (Q4), said second pull-down transistor (Q4) having its collector connected to the output node and its emitter connected to the ground potential, whereby output impedance is increased towards the end of an output transition and energy stored in parasitic inductance is decreased by said pull-up and pull-down transistors so as to reduce the inductive ringing while accelerating the completion of the output transition.

12. An output buffer as claimed in claim 11, wherein said second pull-up transistor (Q2) and said second pull-down transistor (Q4) are delayed in their turn-on times relative to the respective said first pull-up transistor (Q1) and said first pull-down transistor (Q3).

13. An output buffer as claimed in claim 12, further comprising first logic means responsive to a data input signal making a high-to-low transition for generating the first control signal.

14. An output buffer as claimed in claim 13, wherein said first logic means comprises a second NOR logic gate (36).

15. An output buffer as claimed in claim 14, further comprising second logic means responsive to the data input signal making a low-to-high transition for generating the second control signal.

16. An output buffer as claimed in claim 15, wherein said second logic means comprises a second NAND logic gate (40).

17. An output buffer as claimed in claim 16, wherein said first pull-up transistor (Q1) is initially turned on followed quickly by the turning on of said second pull-up transistor (Q2) for generating the low-to-high transition at the output node, and wherein said first pull-up transistor (Q1) turns off at the end of the low-to-high transition so as to increase the output impedance.

18. An output buffer as claimed in claim 17, wherein said first pull-down transistor (Q3) is initially turned on followed quickly by the turning on of said second pull-down transistor (Q4) for generating the high-to-low transition at the output node, and wherein said first pull-down transistor (Q3) turns off at the end of the high-to-low transition so as to increase the output impedance.

* * * * *